United States Patent [19]
Rohde et al.

[11] Patent Number: 5,667,128
[45] Date of Patent: Sep. 16, 1997

[54] WORKSTATION FOR PROCESSING A FLEXIBLE MEMBRANE

[75] Inventors: Terry L. Rohde, Delray Beach; Kenneth D. Kurtz, West Palm Beach, both of Fla.

[73] Assignee: Motorola, Inc., Schaumburg, Ill.

[21] Appl. No.: 537,953

[22] Filed: Oct. 2, 1995

[51] Int. Cl.[6] ............................................. H01L 21/68
[52] U.S. Cl. ............................................. 228/49.5; 269/21
[58] Field of Search ............................................. 269/21; 228/6.2, 228/180.21, 180.22, 212, 49.5

[56] References Cited

U.S. PATENT DOCUMENTS

| | | | |
|---|---|---|---|
| 2,989,827 | 6/1961 | Groth | 269/21 X |
| 4,573,627 | 3/1986 | Miller et al. | 228/180.21 |
| 5,341,979 | 8/1994 | Gupta | 228/180.21 X |
| 5,370,301 | 12/1994 | Belcher et al. | 228/180.22 |

*Primary Examiner*—Kenneth J. Ramsey
*Attorney, Agent, or Firm*—Douglas D. Fekete; John B. MacIntyre

[57] ABSTRACT

The present invention provides a workstation for processing a flexible membrane (16). A frame (14) defines an opening (24) adapted to receive and support the flexible membrane (16). A platform (12) supports and heats the flexible membrane (16) during processing. The platform (12) includes a membrane-support surface (20) and a frame-support surface (18) about the membrane-support surface (20) for engaging the lower surface (38) during processing. The frame-support surface (18) is axially spaced apart from the membrane-support surface (20) such that engagement with the membrane-support surface (20) causes disengagement of the flexible membrane (16) from frame (14). The platform (12) further includes vacuum means (22) for urging the flexible membrane (16) against the membrane-support surface (20) and heating means for heating the platform (12). This heats the flexible membrane (16) resting on the membrane-support surface (20) and also heats the frame (14) resting on the frame-support surface (18).

10 Claims, 3 Drawing Sheets

WORKSTATION FOR PROCESSING A FLEXIBLE MEMBRANE

FIELD OF THE INVENTION

This invention relates generally to a workstation for processing a flexible membrane. More particularly, this invention relates to such a workstation wherein the flexible membrane is carried by a frame to a heated platform.

BACKGROUND OF THE INVENTION

Thermo-compression bonding is a process of attaching an electronic component, such as an integrated circuit die, to a substrate. This is accomplished by bonding solder bumps on the component to bond pads on the substrate using a combination of heat and pressure. The resultant solder bump interconnection is effective to convey electrical signals between the component and the substrate.

In thermo-compression bonding, a substrate must be transported and heated such that the substrate is held in place and such that the thermal expansion of a frame, which can have a different coefficient of expansion than the substrate, does not effect the location or surface flatness of the substrate. The bumped surface of the substrate must be substantially parallel to the die for a successful thermo-compression bond. Therefore, it is crucial for the substrate to be flat and to remain flush with the heated platform during processing.

Current technology nests a substrate in a pallet, known as a carbon boat, and requires the carbon boat to be elevated to a proper temperature to conductively heat the substrate to a temperature sufficient to allow thermo-compression bonding. However, due to imperfections in the carbon boats, the surface flatness cannot be reliably assured and the die and the surface of the substrate cannot be guaranteed to be parallel to a degree necessary to assure effective thermo-compression.

Prior art workstations mechanically grip the substrate and move it to a carbon boat. Flexible membranes, composed of thin polymeric film, are used as substrates. Because of the fragile nature of flexible membranes, prior art mechanical workstations cannot effectively process flexible membranes due to the inability of current mechanical grippers to secure flexible membranes without damaging them.

Therefore, a need exists for a workstation that is capable of thermo-compressing dies onto a flexible membrane without manually or robotically gripping the flexible membrane.

DETAILED DESCRIPTION OF A PREFERRED EMBODIMENT

In accordance with a preferred embodiment, the present invention provides a workstation for processing a flexible membrane. The workstation includes a platform. A frame transports the flexible membrane to and from the platform and defines an opening sized and shaped to receive the flexible membrane. The frame includes a lower face and lips for supporting the flexible membrane within the opening. The flexible membrane is spaced apart from the lower face of the frame by a first distance x.

The frame carries the flexible membrane to the platform, which supports and heats the flexible membrane during processing. The platform includes a membrane-support surface and a frame-support surface about the membrane-support surface. The frame-support surface is axially spaced apart from the membrane-support surface by a second distance y, which is greater than the first distance x. The platform further includes vacuum passages in communication with the membrane-support surface. During processing, a vacuum force is applied through the vacuum passages to urge the flexible membrane against the membrane-support surface. The platform further comprises heating means for heating the platform.

The platform heats the flexible membrane, which is resting on the membrane-support surface, and simultaneously heats the frame, which is resting on the frame-support surface. Heating the flexible membrane prepares the membrane for thermo-compression bonding of a die on bond pads on the membrane. Independently heating the frame brings the frame to a temperature close to that of the membrane. This allows the frame to expand to accommodate the membrane once processing is complete, and also prevents thermal shock that would occur if the heated membrane were to come into contact with a frame having a substantially lower temperature.

Figure 1:
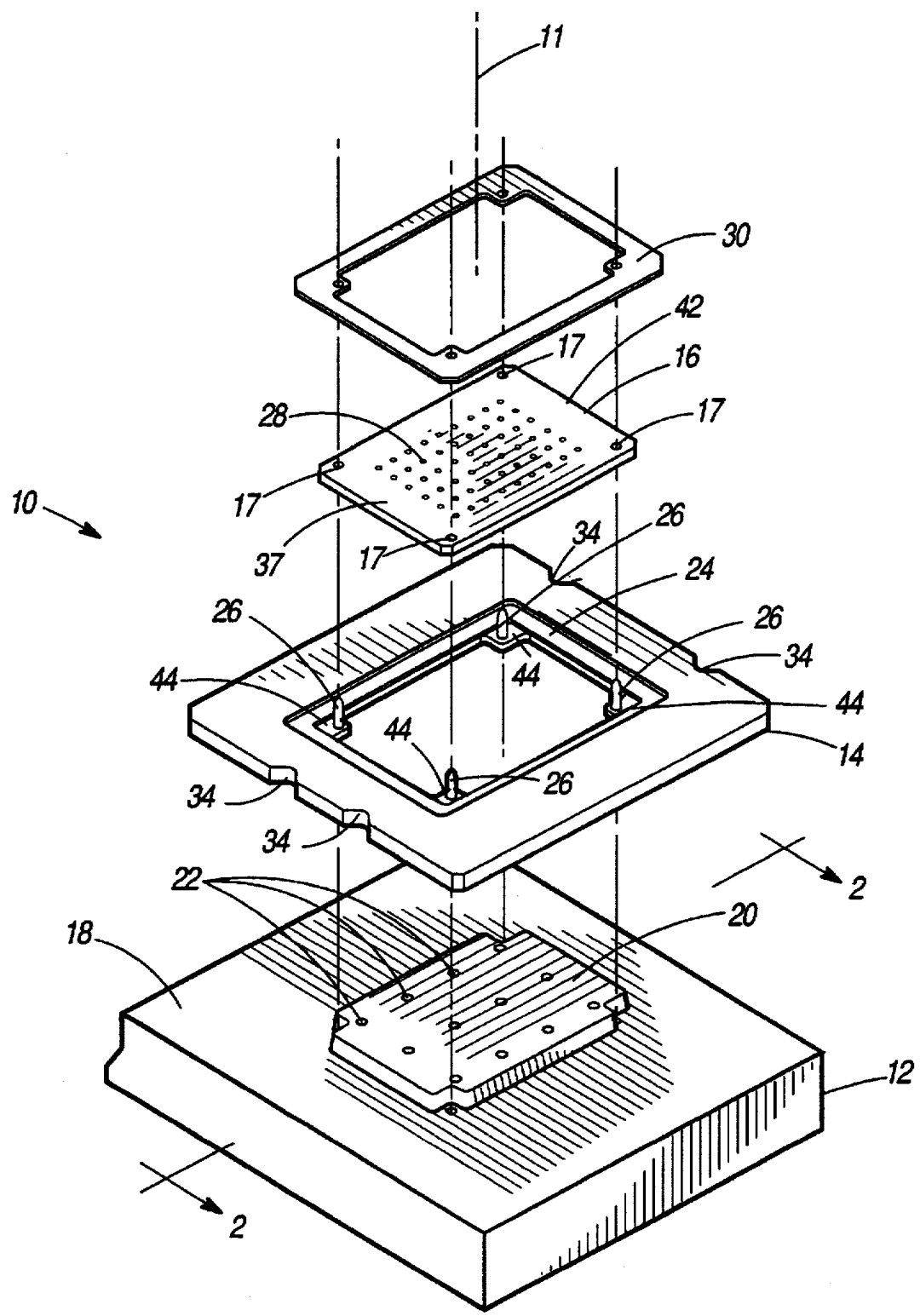
FIG. 1 is an exploded perspective view of a workstation in accordance with a preferred embodiment of the present invention.
Figure 2:
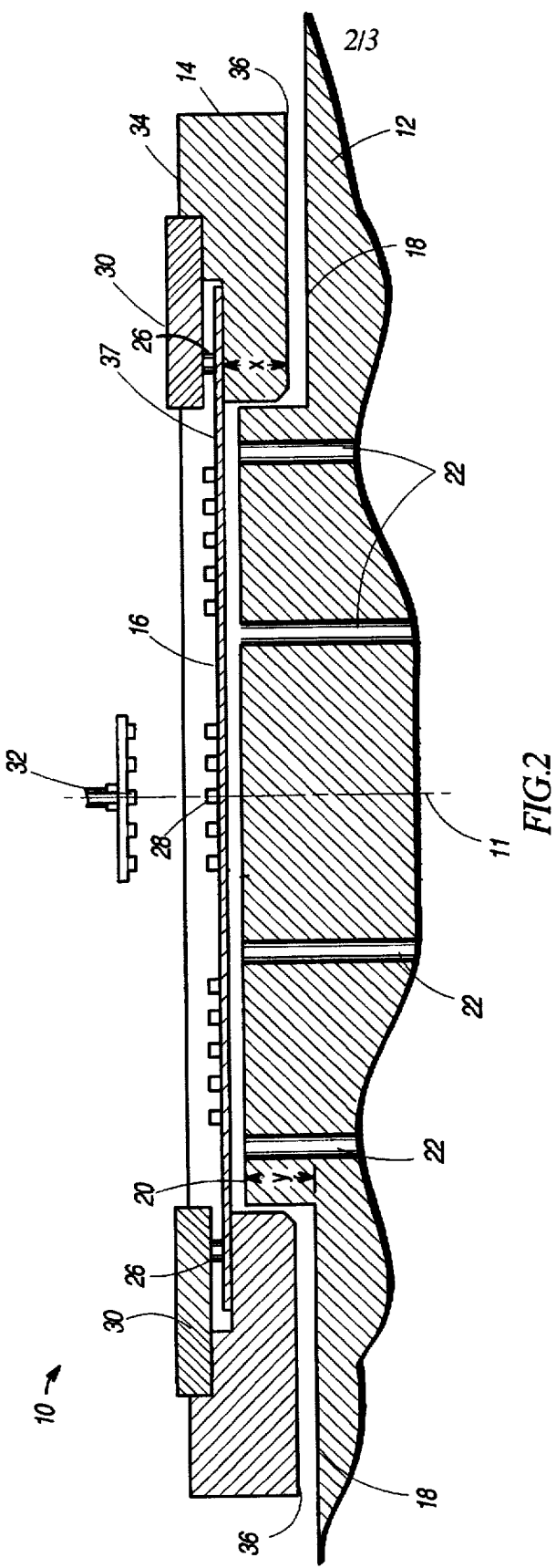
FIG. 2 a cross-sectional elevation view of a workstation prior to disengagement of a flexible membrane from a frame in accordance with a preferred embodiment of the present invention.
Figure 3:
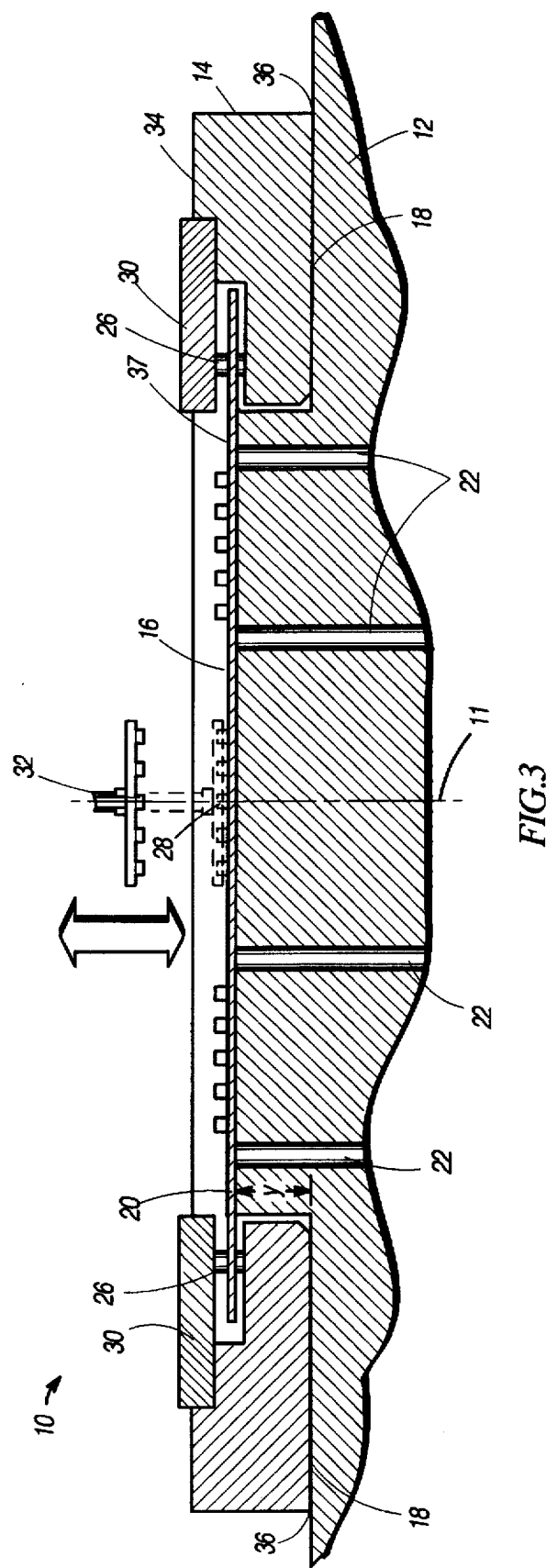
FIG. 3 is a cross-sectional elevation view of a workstation subsequent to disengagement of a flexible membrane from a frame in accordance with a preferred embodiment of the present invention.

The present invention can be better understood with reference to FIGS. 1–3. In a preferred embodiment, integrated circuit die 32 is bonded to a flexible membrane 16. Die 32 has a plurality of solder bumps extending from a bottom surface of die 32. Die 32 is capable of being bonded to a bond pad 28 on a flexible membrane 16. During bonding, heat and pressure are applied to bond the solder bumps to the bond pads.

In a preferred embodiment, flexible membrane 16 has a perimeter 42 and is composed of a thin, flexible, generally rectangular polymeric substrate and a plurality of bond pads affixed thereto. Membrane 16 has a plurality of bond pads, such as bond pad 28, formed on membrane upper surface 37 that are effective to form a bond with die 32 by way of a thermo-compression process. In a preferred embodiment, flexible membrane 16 has bores 17 in corners of flexible membrane 16 effective to receive pins 26 and effective to locate and secure flexible membrane 16 during processing.

Frame 14 defines an opening 24 and comprises lips 44 extending into opening 24 and having surfaces effective to support flexible membrane 16. Frame axis 11 is defined as being perpendicular to a plane defined by the surface of lips 44. In a preferred embodiment, frame 14 has locator pins 26 disposed about lips 44, pins 26 being axially receivable in bores 17 and being effective to position and secure flexible membrane 16 within frame 14 during processing. In a preferred embodiment, frame 14 is composed of stainless steel. Frame 14 can alternately be composed of aluminum or titanium.

Frame 14 comprises substantially planar lower face 36. Notches 34 are provided to accommodate parallel jaw grippers of a robotic arm (not shown) which register frame 14 via notches 34 located on side surfaces of frame 14. Frame 14 is carried to and from platform 12 by the robotic arm for processing. In a preferred embodiment, a hold-down frame 30 is placed on frame 14 subsequent to engagement of membrane 16 to further assist in securing flexible membrane 16 within frame 14. Hold-down frame 30 defines an opening that permits access to bond pad 28 located on upper surface 37 of membrane 16. Hold-down frame 30 rests on surfaces of opening 24 during processing and does not interfere with the expansion of flexible membrane 16, but keeps membrane 16 from displacing from pins 26 during travel to and from platform 12. Frame 14 is employed to carry flexible membrane 16 to and from platform 12.

In accordance with a preferred embodiment of the present invention, workstation 10 comprises a platform 12. Platform 12 comprises a substantially planar membrane-support surface 20 and a substantially planar frame-support surface 18 about the membrane-support surface 20. Membrane-support surface 20 is substantially parallel to frame-support surface 18 and is raised above frame-support surface 18 by a second distance y. Disposed within membrane-support surface 20 are a plurality of vacuum passages 22. Vacuum passages 22 communicate with membrane-support surface 20 and a vacuum pump (not shown) located remote from workstation 10.

In a preferred embodiment, frame 14 receives flexible membrane 16. Lips 44 support perimeter 42 of flexible membrane 16. In a preferred embodiment, lips 44 support each of the four corners of flexible membrane 16. This provides adequate support for flexible membrane 16 within frame 14 and also allows bond pads 28 to be located over most of the surface area of flexible membrane 16. First distance x is defined as the distance between frame lower face 36 and membrane lower surface 38. Hold-down frame 30 is received by frame 14 and further assists in securing membrane 16 within frame 14 during carrying to and from platform 12. Frame 14 is then carried to platform 12 by a robotic arm.

FIG. 2 shows workstation 10 and the frame assembly, comprising frame 14, flexible circuit 16, and hold-down frame 30, upon arrival at platform 12. Frame 14 extends about a raised membrane-support surface 20 on platform 12 and is axially lowered by a robotic arm to a position wherein membrane 16 is flush with membrane-support surface 20. Second distance y, defined as the height of membrane-support surface 20, must be at least as high as the first distance x to ensure that flexible circuit 16 will disengage from frame 14 during processing. Flexible membrane 16 rests on membrane-support surface 20, which in a preferred embodiment has been pre-heated to a desired processing temperature, and is urged against the membrane-support surface 20 by reduced air pressure within vacuum passages 22. Vacuum passages 22 are offset from bond pads 28 so as to not underlie bond pads 28. This allows successful thermo-compression without puncturing flexible membrane 16.

With reference to FIG. 3, in preparation for die attach, frame 14 is axially lowered by a robotic arm and disengages from flexible membrane 16 and comes to rest on frame-support surface 18 of heated platform 12. During the heating and thermo-compression of membrane 16, membrane 16 is supported by membrane-support surface 20 and is located between frame 14 and hold-down frame 30. It is a feature of the present invention that flexible membrane 16 disengages from frame 14 during processing, which prevents frame 14 from interfering with the thermo-compression bonding of flexible membrane 16. Frame 14 and flexible membrane 16 are heated by platform 12 through frame-support surface 18 and membrane-support surface 20, respectively. Flexible membrane 16 is heated to a temperature sufficient to allow thermo-compression of die 32 onto bond pad 28 of flexible membrane 16. In a preferred embodiment, flexible membrane 16 is heated to a temperature of about 300° C.

In a preferred embodiment, die 32 and bond pad 28 are aligned using an optical vision system. Upon alignment, die 32 is axially lowered and compressed onto bond pad 28 on heated flexible membrane 16 to form interconnections that bond die 32 to membrane 16. In a preferred embodiment, die 32 is axially lowered and subsequently vibrated to ensure reliable contact with bond pad 28. In a preferred embodiment, processing includes bonding numerous dies onto numerous bond pads. When processing is complete, frame 14 is axially lifted by a robotic arm to re-engage membrane 16. Pins 26 are axially slidably received in bores 17 and membrane 16 is carried from platform 12.

During processing, air pressure is reduced through vacuum passages 22 to urge flexible membrane 16 against membrane-support surface 20. This keeps flexible membrane 16 flat and flush with membrane-support surface 20 and prevents movement of membrane 16 during processing. This assures accurate placement of die 32 onto bond pad 28 on membrane 16.

It is a feature of the present invention that bores 17 have a diameter greater than that of pins 26 to provide clearance to accommodate thermal expansion of membrane 16 during heating. Flexible membrane 16 is spaced apart from the bulk of pins 26 due to the larger diameters of bores 17. This allows independent heating and subsequent expansion of flexible membrane 16 and frame 14 and further allows for successful thermo-compression of membrane 16 without interference from frame 14. The larger diameter of bores 17 allows for later re-engagement of membrane 16 by frame 14 after heating and thermo-compression has been accomplished. In this manner, when thermo-compression bonding is complete, frame 14 is axially raised and re-engages membrane 16. It is a feature of the present invention that the re-engagement of membrane 16 onto lips 44 of frame 14 will occur although differences in expansions occurred during processing.

The present invention provides a frame and workstation combination for processing a flexible membrane. In a preferred embodiment, the flexible membrane is nested in a frame. By disengaging the flexible membrane from the frame during processing, accurate placement of dies occurs on the flexible membrane without interference from the frame. The flexible membrane and the frame are permitted to independently expand during heating. The frame allows access to the bottom of the flexible membrane, thereby allowing the flexible membrane to be processed without having to mechanically grip the membrane. This is beneficial due to the fragile nature of flexible membranes. By placing the flexible membrane directly onto the platform, problems with surface flatness associated with carbon boats have been eliminated, along with the bonding problems associated with having a substrate that is not parallel with the die being thermo-compressed. The frame, which is heated during processing, re-engages the membrane when the processing is complete. The chance of thermal shock damaging the substrate upon re-engagement is lessened due to the heating of the frame during processing. In this manner, dies are effectively thermo-compressed onto bond pads disposed on a flexible membrane.

While this invention has been described in terms of certain examples thereof, it is not intended that it be limited to the above description, but rather only to the extent set forth in the claims that follow.

The embodiments of this invention in which an exclusive property or privilege is claimed are defined as follows:

1. A workstation for processing a flexible membrane, comprising:

a frame for transporting a flexible membrane to and from the workstation, said frame comprising a lower face and defining an opening adapted to receive the flexible membrane and support the flexible membrane in a plane perpendicular to an axis and axially spaced apart from the lower face by a first distance; and a platform for supporting and heating the flexible membrane during processing, said platform comprising a membrane-support surface and a frame-support surface about the membrane-support surface, the frame-support surface being axially spaced apart from the membrane-support surface by a second distance greater than the first distance, said platform further comprising vacuum means in communication with the membrane-support surface for urging a flexible membrane against the membrane-support surface and heating means for heating said platform to thereby heat a flexible membrane resting on the membrane-support surface and to Concurrently heat a frame resting on the frame-support surface.

2. A workstation in accordance with claim 1, wherein said frame further comprises a hold-down frame for securing the flexible membrane within the frame.

3. A workstation in accordance with claim 1 wherein said frame is adapted to receive a flexible membrane having a perimeter and comprises a lip that extends into the opening to support the perimeter of the flexible membrane.

4. A workstation in accordance with claim 1, wherein the lower surface of said frame includes the opening to permit access to the lower surface of the flexible membrane.

5. A workstation in accordance with claim 1, wherein the membrane-support surface comprises a solid region for support of the flexible membrane during bonding and wherein the vacuum means comprises vacuum passages spaced apart from the solid region.

6. A workstation for processing a flexible membrane having upper and lower surfaces, a perimeter, and at least one bore extending between the upper and lower surfaces, said workstation comprising:

a frame for transporting a flexible membrane to and from the workstation, said frame defining an opening adapted to receive the flexible membrane and comprising:

an upper and lower face;

a lip extending into the opening for supporting the perimeter of the flexible membrane within the opening such that the flexible membrane is generally planar and perpendicular to a frame axis, and further such that the flexible membrane is axially spaced apart from the lower face by a first distance; and a platform for supporting and heating the: flexible membrane during processing, said platform comprising:

a membrane-support surface that is substantially planar and is perpendicular to an axis;

a frame-support surface about the membrane-support surface for engaging the lower face during processing and axially spaced apart from the membrane-support surface by a second distance greater than the first distance;

vacuum means in communication with the membrane-support surface for urging a flexible membrane against the membrane-support surface; and heating means for heating the platform to heat a flexible membrane resting on the membrane-support surface and to concurrently heat a frame resting on the frame-support surface.

7. A workstation in accordance with claim 6, wherein the lower face is substantially planar.

8. A workstation in accordance with claim 6, wherein the frame-support surface is substantially planar.

9. A workstation in accordance with claim 6, wherein the frame-support surface is substantially parallel to the membrane-support surface.

10. A workstation for processing a flexible membrane having upper and lower surfaces, a perimeter, and at least one bore extending between the upper and lower surfaces, said workstation comprising:

a frame for transporting a flexible membrane to and from the workstation, said frame defining an opening adapted to receive the flexible membrane and comprising:

an upper and lower face;

a lip extending into the opening for supporting the perimeter of the flexible membrane within the opening such that the flexible membrane is generally planar and perpendicular to a frame axis, and further such that the flexible membrane is axially spaced apart from the lower face by a first distance; and at least one axial pin disposed within the opening and slidably receivable within the bore of said flexible membrane for positioning the flexible membrane within the opening; and a platform for supporting and heating the flexible membrane during processing, said platform comprising:

a membrane-support surface that is substantially planar and is perpendicular to an axis;

a frame-support surface about the membrane-support surface for engaging the lower face during processing and axially spaced apart from the membrane-support surface by a second distance greater than the first distance;

vacuum means in communication with the membrane-support surface for urging a flexible membrane against the membrane-support surface; and heating means for heating the platform to heat a flexible membrane resting on the membrane-support surface and to simultaneously heat a frame resting on the frame-support surface.

* * * * *

UNITED STATES PATENT AND TRADEMARK OFFICE
CERTIFICATE OF CORRECTION

PATENT NO. : 5,667,128
DATED : September 16, 1997
INVENTOR(S) : Terry L. Rohde, Kenneth D. Kurtz It is certified that error appears in the above-indentified patent and that said Letters Patent is hereby corrected as shown below:

Column 5, line 24 reads "Concurrently" should read --concurrently--

Column 5, line 28 reads "claim 1" should read --claim 1,--

Column 5, line 56 reads "the: flexible" should read --the flexible--

Signed and Sealed this

Seventeenth Day of February, 1998

Attest:

BRUCE LEHMAN

Attesting Officer

Commissioner of Patents and Trademarks